(12) United States Patent
Johnson

(10) Patent No.: US 7,608,788 B2
(45) Date of Patent: Oct. 27, 2009

(54) PLATING BUSS AND A METHOD OF USE THEREOF

(75) Inventor: Mark S. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/869,204

(22) Filed: Oct. 9, 2007

(65) Prior Publication Data

US 2008/0023220 A1    Jan. 31, 2008

Related U.S. Application Data

(60) Division of application No. 11/492,650, filed on Jul. 25, 2006, now Pat. No. 7,296,346, which is a continuation of application No. 10/861,847, filed on Jun. 4, 2004, now Pat. No. 7,181,837.

(51) Int. Cl.
*H01R 12/04* (2006.01)
*H05K 1/11* (2006.01)

(52) U.S. Cl. ...................................... 174/261
(58) Field of Classification Search .................. 174/261
See application file for complete search history.

(56) References Cited

U.S. PATENT DOCUMENTS

| | | | |
|---|---|---|---|
| 5,132,878 A | 7/1992 | Carey | |
| 5,976,341 A | 11/1999 | Schumacher et al. | |
| 6,040,702 A | 3/2000 | Hembree et al. | |
| 6,313,651 B1 | 11/2001 | Hembree et al. | |
| 6,319,418 B1 | 11/2001 | Verdeflor et al. | |
| 6,348,142 B1 | 2/2002 | Vivares et al. | |
| 6,426,290 B1 | 7/2002 | Vivares et al. | |
| 6,432,291 B1 | 8/2002 | Vivares et al. | |
| 6,479,894 B2 * | 11/2002 | Huang et al. | 257/691 |
| 6,632,343 B1 | 10/2003 | Farnworth et al. | |
| 6,691,696 B2 | 2/2004 | Akram et al. | |
| 6,908,784 B1 | 6/2005 | Farnworth et al. | |
| 6,957,963 B2 | 10/2005 | Rathburn | |
| 2002/0145178 A1 | 10/2002 | Tsao et al. | |
| 2002/0157958 A1 * | 10/2002 | Kikuchi et al. | 205/118 |

FOREIGN PATENT DOCUMENTS

EP     1381260 A1    4/2004

OTHER PUBLICATIONS

M. Lampton et al., Stacked Orthogonal Serpentine Delay Lines with Vias for Two-Dimensional Microchannel Plate Readout, Review of Scientific Instruments vol. 71, No. 12, pp. 4611-4619, Dec. 2000.

* cited by examiner

*Primary Examiner*—Jeremy C Norris
(74) *Attorney, Agent, or Firm*—Dinsmore & Shohl LLP

(57) ABSTRACT

The present invention relates generally to a plating buss design and method for minimizing short circuit problems in PCB panel singulation. More particularly, the invention encompasses a serpentine plating buss which increases the PCB singulation process window thereby minimizing short circuit problems due to indexing errors caused by occasional manufacturing and equipment alignment problems. The serpentine plating buss design therefore increases board yield.

17 Claims, 6 Drawing Sheets

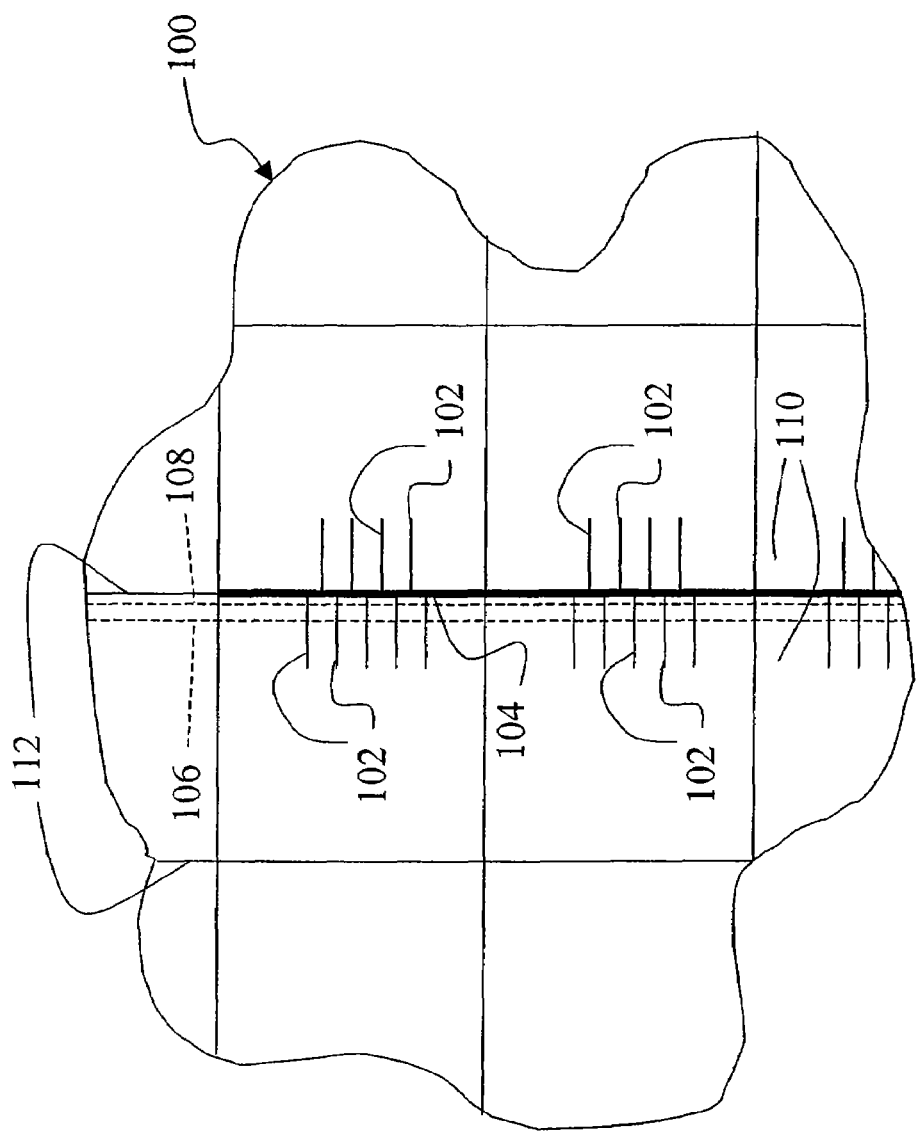

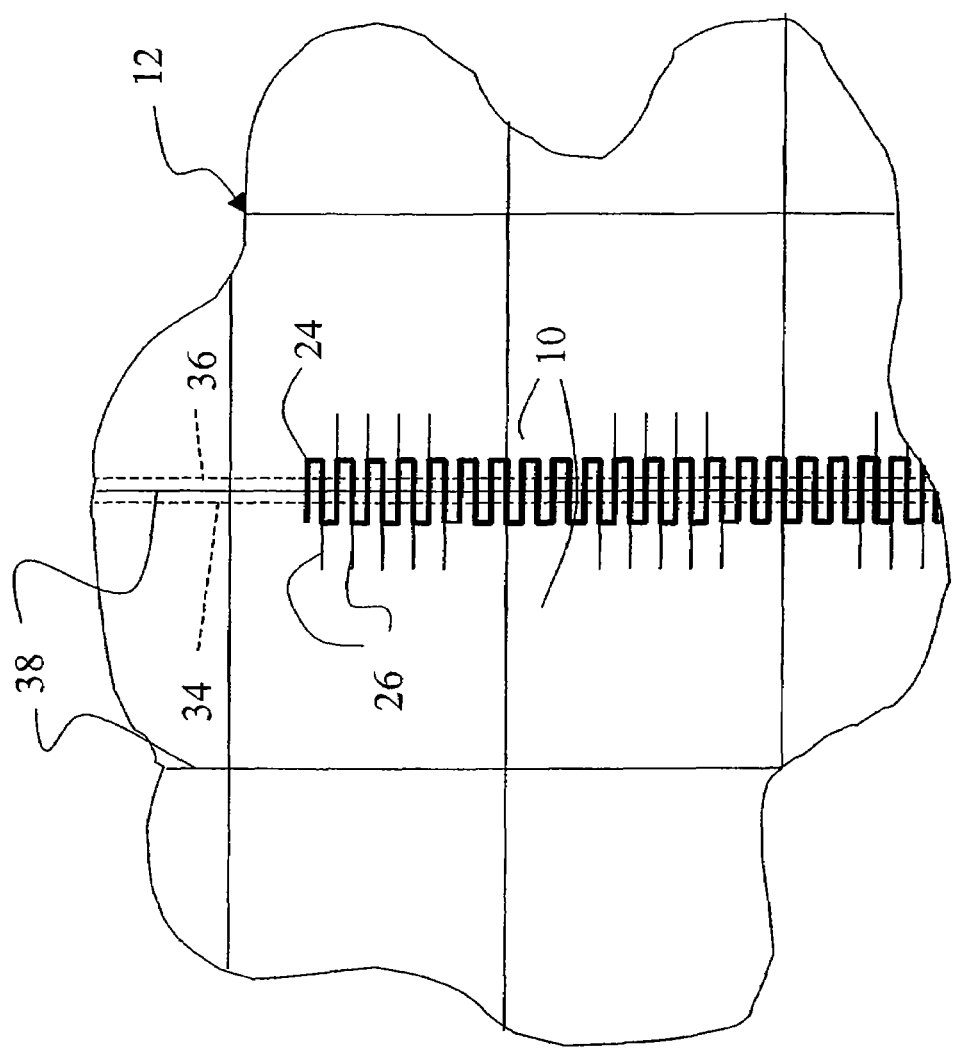

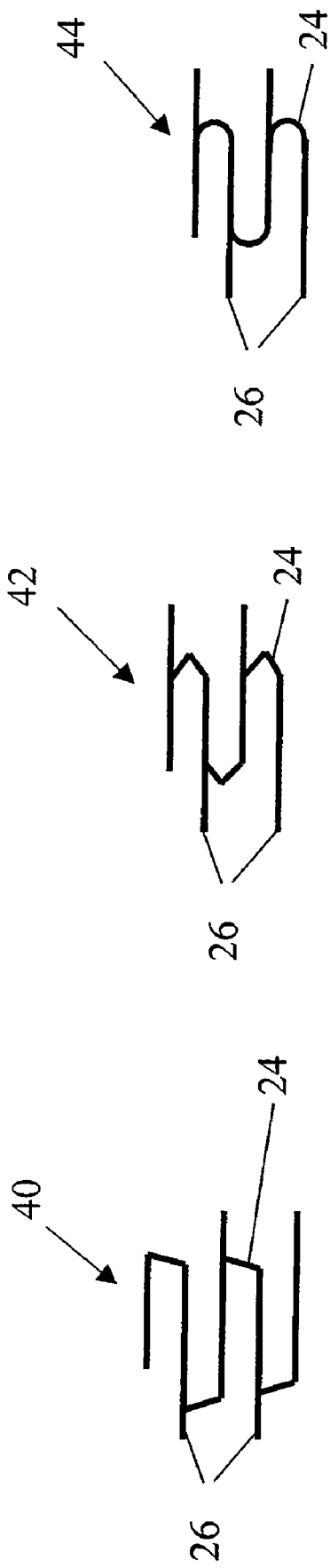

PLATING BUSS AND A METHOD OF USE THEREOF

CROSS REFERENCE TO RELATED APPLICATIONS

This application is a divisional of U.S. application Ser. No. 11/492,650, filed Jul. 25, 2006 now U.S. Pat. No. 7,296,346, which is a continuation of U.S. application Ser. No. 10/861,847, filed Jun. 4, 2004, now U.S. Pat. No. 7,181,837.

BACKGROUND OF THE INVENTION

The present invention relates generally to the field of printed circuit fabrication, and more particularly to an improved plating buss on a substrate such as for example a printed circuit board (PCB), which addresses manufacturing variations and alignment problems associated with PCB singulation for improved board yield.

Basically, a printed circuit board consists of a sheet of rigid insulating substrate such as phenolic, glass impregnated epoxy or the like, having a pre-defined pattern of thin metallic—usually copper—foil conductive paths (so-called "traces") appearing on one or both sides of the substrate. These traces collectively define all the electrical interconnections among all the components and are routed between appropriate locations on the board.

Electrolytic plating is one method used to improve electrical conductivity and/or wire bondability in the trace termination areas provided on a multi-layered printed circuit board (PCB). Generally, a panel populated with an array of PCBs is connected to one terminal of either a d.c. or a pulsed plating voltage source and placed in an electrolyte in order to be plated. A metal to be deposited is then connected to the other terminal and similarly immersed in the electrolyte. The transfer of the metal is accomplished via the ions contained in the current flowing between the metal and the panel.

Since electroplating of metals requires that all sites on the panel to be plated must be electrically connected to the plating bath, one prior art method electrically connects the traces to a common straight-line plating buss (also known as a "tie" or "commoning" bar) for convenience. The straight-line plating buss is then used to provide the current during the plating process. However, a plating buss serves no useful function after the electroplating process. Thus, for improved process efficiency, prior art methods have provided the straight-line plating buss centered between adjacent PCBs defined on the panel, such that during a PCB singulation stage, the straight-line plating buss gets cut away.

PCB singulation is the process of taking a finished panel, and separating or depaneling the plurality of PCBs formed thereon into individual PCBs for a subsequent packaging process. One method of PCB singulation is to use a dicing saw. The panel is mounted on a saw carrier, mechanically, adhesively or otherwise, as known in the art. The saw carrier is then mounted on a stage of the dicing saw. Typically, the PCBs are arranged in rows and columns on the panel with the periphery of each PCB being rectangular. During the dicing process, the panel is sawn or diced with a rotating blade along a street lying between each of the rows and columns thereof.

Once all cuts associated with mutually parallel streets having one orientation are complete, either the blade is rotated 90° relative to the panel or the panel is rotated 90°, and cuts are made through streets in a direction perpendicular to the initial direction of cut. Since each PCB on a conventional panel has the same size and rectangular configuration, each pass of the saw blade is incrementally indexed one unit (a unit being equal to the distance from one street to the next) in a particular orientation of the panel. As such, the saw and the software controlling it are designed to provide uniform and precise indexing in fixed increments across the surface of the panel.

As mentioned previously above, PCB singulation is also used to remove process remnants, such as straight-line plating busses used in the (post formation) plating process of the PCBs. An illustration of one prior art plating buss is shown in FIG. 1, wherein a PCB panel 100 has a plurality of traces 102 formed thereon by electrodeposition, which are connected by an associated straight-line plating buss 104. At the PCB singulation stage, a saw blade dices the panel 100 along a cut, which removes panel material between parallel lines 106 and 108 in order to separate adjacent PCB segments 110. If the cut is properly aligned, parallel lines 106 and 108 will flank a street 112 defined between the adjacent PCB segments 112 in order to also remove the straight-line plating buss 104 which was formed there along. As can be imaged, dicing the panel along the street 112 will thereby disconnect the associated traces 102. According the width on the straight-line plating buss 104 can be considered as the "process window" for the PCB singulation stage.

However, over time, the blade and/or stage of the dicing saw may experience drift due to indexing errors of its drive motor and associated gearing. Additionally, variations in the PCB manufacturing process effecting PCB sizes and street locations, and variations in blade width due to uneven heating and wear can also result in indexing errors. Such indexing errors result potentially in the location of cut, illustrated by parallel lines 106 and 108, moving off the street 112 and out of the process window. As illustrated by FIG. 2, moving off the street 112 creates the potential for shorted circuits due to the cut failing to remove the straight-line plating buss 104 connecting the traces 102 in one of the adjacent PCB segments 110. This circumstance decreasing board yield by rejecting PCBs with shorted traces even though all other features on each PCB may be good.

SUMMARY OF THE INVENTION

In view of the foregoing considerations, the present invention is directed to an improved plating buss, wherein the plating buss connecting traces of adjacent printed circuit board (PCB) in a substrate panel are provided in a serpentine design. The serpentine plating buss widens the PCB singulation process window, thereby minimizing short circuit problems often seen in PCB singulation due to indexing errors resulting from occasional manufacturing variations and alignment problems. Accordingly, the serpentine plating buss of the present invention increases board yield. Another benefit of the serpentine plating buss is that the sawn edge of each finished PCB may be improved due to the fact that no longer must PCB singulation be directly on top of the entire plating buss in order to disconnect joined conductive traces.

In one embodiment, a substrate panel containing a plurality of printed circuit boards is disclosed. The substrate panel comprises a plurality of conductive traces provided on the substrate, and a serpentine plating buss interconnecting the plurality of conductive traces and provided between adjacent ones of the plurality of printed circuit boards.

In another embodiment, a method for manufacturing a printed circuit is disclosed. The method comprises providing a substrate panel, providing a plurality of printed circuit boards on the substrate, the printed circuit boards having a plurality of conductive traces provided on the substrate, and interconnecting the plurality of conductive traces with a serpentine plating buss provided on the substrate between adjacent ones of the plurality of printed circuit boards.

In another embodiment, a method for manufacturing a printed circuit is disclosed. The method comprises providing a substrate having at least a pair of adjacent segments, the substrate having a conductive serpentine plating buss interconnecting conductive traces of the pair of adjacent segments, and singulating the substrate, the singulation removing a portion of the serpentine plating buss which disconnects the conductive traces.

In still another embodiment, a method for manufacturing a printed circuit board is disclosed comprising providing an unclad laminated substrate panel used for forming a plurality of printed circuit boards, associating an image of a desired circuitry pattern with the panel, the image comprises various circuitry traces interconnected by a serpentine plate buss, and developing the panel, wherein the desired circuitry pattern is defined on the panel.

These and other features and objects of the present invention will be apparent in light of the description of the invention embodied herein.

BRIEF DESCRIPTION OF THE SEVERAL VIEWS OF THE DRAWINGS

FIG. 2 is a top elevation of a portion of a substrate panel bearing conductive traces connected by a prior art straight-line plating buss, and illustrating the alignment of a singulation cut having an indexing error which will result in shorted traces;

FIG. 4 is a top elevation of a portion of a substrate panel bearing conductive traces connected by a plating buss according to the present invention, illustrating the alignment of a singulation cut having no indexing error which will result in no shorted traces;

FIGS. 6a-6c are illustrations of various serpentine plating buss embodiments according to the present invention.

Figure 1:
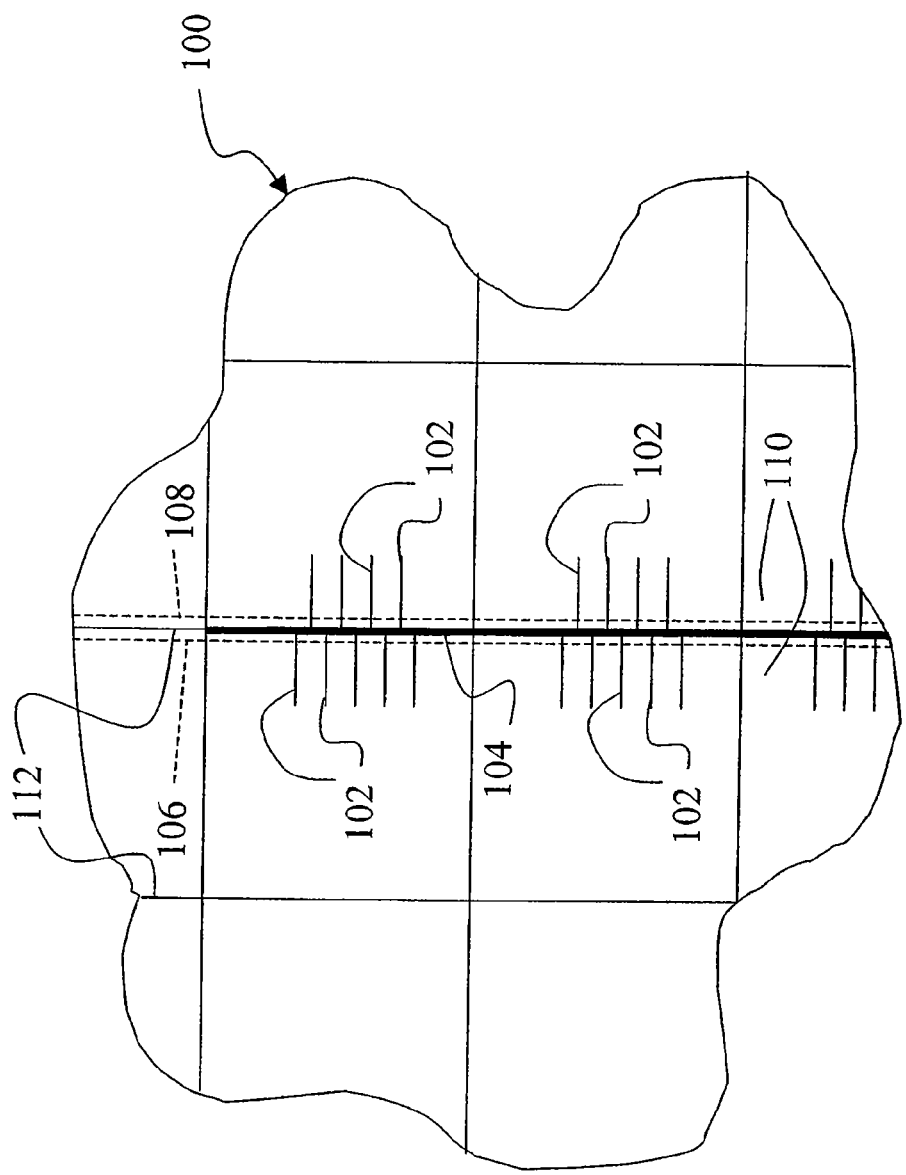
FIG. 1 is a top elevation of a portion of a substrate panel bearing conductive traces connected by a prior art straight-line plating buss, and illustrating the alignment of a singulation cut having no indexing error which will result in no shorted traces.

In the drawings, dimensions of materials have been modified for clarity of illustration and are not necessarily true to scale.

DETAILED DESCRIPTION OF THE INVENTION

FIGS. 3a-3d provides a step-by-step explanation of a printed circuit manufacturing technique used to form a plating buss according to the present invention. In conjunction with this explanation, FIGS. 4 and 5 each present a top elevation of a substrate panel having a plurality of adjacent printed circuit boards (PCBs) thereon and bearing conductive traces connected by a plating buss according to the present invention. FIGS. 6a-6c are illustrations of various serpentine plating buss embodiments according to the present invention.

Figure 3B:
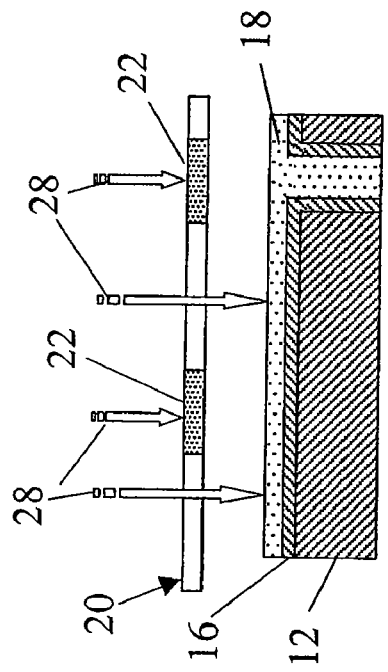
FIGS. 3a-3d are side section views of a substrate panel showing a step-by-step explanation of a printed circuit manufacturing technique used to form the plating buss of the present invention.
Figure 3D:
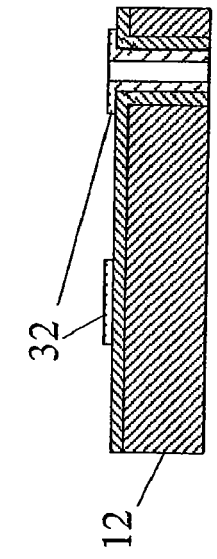
Figure 3A:
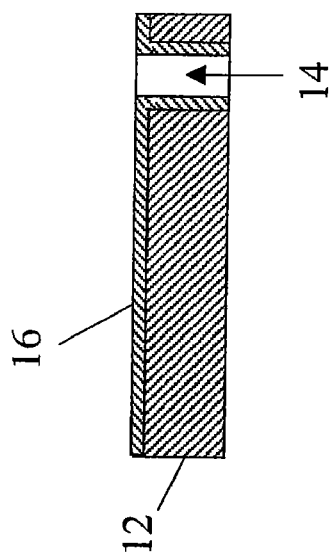

With reference to FIG. 3a, manufacturing of a plurality of PCBs 10 begins similar to most other commonly used additive techniques. Namely, an unclad laminated substrate panel 12 used for forming the plurality of PCBs 10 is first provided. The panel 12 is normally made of a nonconductive material, such as phenolic, glass-impregnated epoxy, polymide, FR4, FR5 or the like. The panel 12 is then drilled in accordance with a predetermined pattern, such as by a C-N-C drilling machine. In particular, variously sized holes 14 are imparted through the panel 12 at a variety of locations, in the exact configuration of a desired hole pattern for each printed circuit. For ease of illustration, FIGS. 4 and 5 do not show any of the holes 14.

The panel 12 is then coated with an activating layer 16 which promotes the adhesion of a conductive material, such as copper, to the unclad laminant panel 12. Following coating, an outer surface of the activating layer 16 is coated with a resist material 18 as illustrated by FIG. 3b. The resist material 18 is preferably a photopolymer plating resist solution well-known in the art, and is normally light sensitive.

A photographic film image or artwork 20 of a desired circuitry pattern 22 is then associated with the panel 12. In particular, the artwork 20 provides a picture or image of various circuitry traces and is properly designed to selectively prevent light from passing through portions of the film. For example, with one well-known technique, the circuitry pattern is presented on the film in the form of an emulsion material which prevents the passage of light. The remainder of the film, where no circuitry is desired, is clear. A maskless, fully digital process, such as for example, a Digital Micromirror Device (DMD) or Gradient Light Valve (GLV) imaging system, may also be used to project a negative of the desired circuitry pattern 22, onto the panel 12 as is known in the art.

Figure 5:
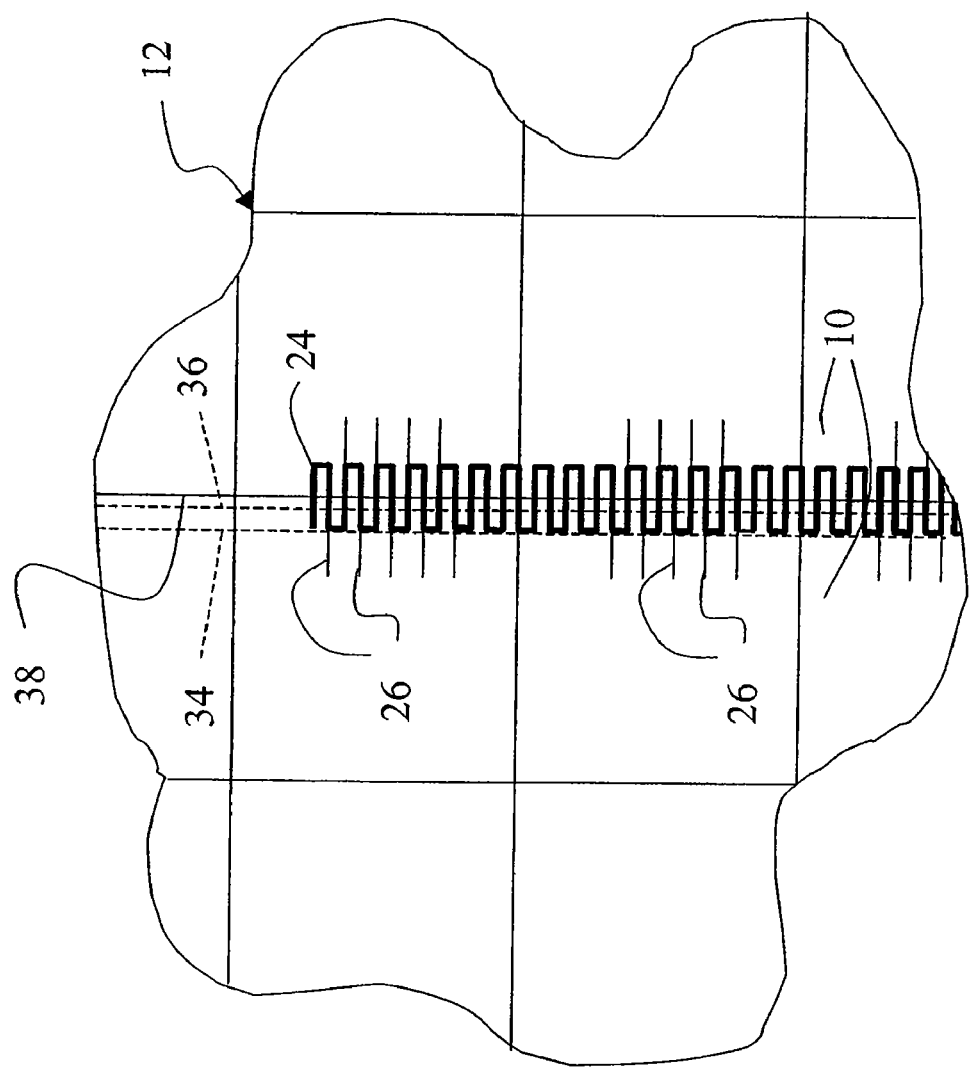
FIG. 5 is a top elevation of a portion of a substrate panel bearing conductive traces connected by a plating buss according to the present invention, illustrating the alignment of a singulation cut having an indexing error which will result still in no shorted traces.

The desired circuitry pattern 22 includes a serpentine plating buss design according to the present invention, which connects together a plurality of traces. One embodiment of the serpentine plating buss 24 is illustrated by FIGS. 4 and 5, which connects a plurality of traces 26 in an "accordion" fashion. It is to be appreciated that the plating buss design of the present invention need not be continuous, equally sized, accordion shaped, or rectangular in dimension. For example, as illustrated by FIGS. 6a-c, the serpentine plating buss of the present invention may be a saw toothed pattern 40, a triangular pattern 42, a curvilinear pattern 44, or combinations thereof. A discussion of the advantages of having such a serpentine plating buss according to the present invention is provided in a later section.

Referring back to FIG. 3b, with the artwork 20 in place, the panel 12 is then "exposed" to ultraviolet light 28. As previously described, the artwork 20 is designed to selectively allow and/or prevent passage of the ultraviolet light 28 at desired locations. The resist material 18 is normally configured to "cure," harden or otherwise react in response to exposure to ultraviolet light such that it is impervious to developer chemistry. At locations on the panel 12 where ultraviolet light is prevented from reaching the resist material 18 (i.e., the desired circuitry pattern), the resist material 18 will not cure, such that it will be attacked by developer chemistry.

Figure 3C:
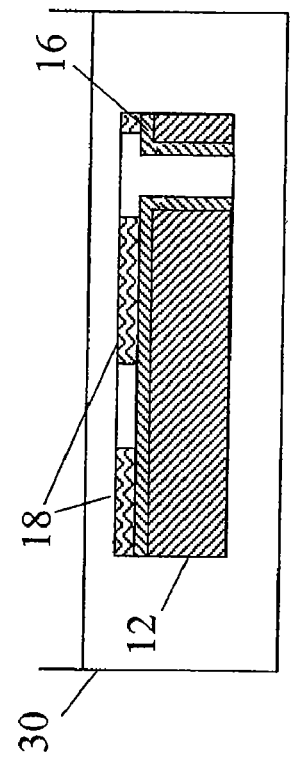

The panel 12 is then "developed". With this commonly-used technique, any resist material 18 not cured during exposure is removed from the panel 12. As illustrated by FIG. 3c, only cured portions of the resist material 18 remain on the panel 12. Following developing, the desired circuitry pattern 22 having the design of the serpentine plating buss 24 is defined on the panel 12. In particular and at this stage, the circuitry pattern 22 is defined by the activating layer 16 not otherwise covered by the resist material 18.

The panel 12 is then processed through an energized plating bath 30 to deposit an electrolytic material layer, such as metals or precious metals like copper, silver, gold, platinum, nickel, tin, and the likes, onto the desired circuitry pattern 22. During the electroplating process, the resist material 18 resists or shields the electrolytic material from plating to certain areas of the panel 12, wherein the electroplated material is deposited only on exposed portions of the activating layer 16. In this manner, only the desired circuitry pattern 22 receives the electroplated material. The panel 12 is then passed to additional (post plating buss formation) electroplating processes, wherein the formed plating busses 24 are then used to make electrical contact for improved electrical conductivity and/or wire bondability in termination (e.g. "trace") areas of each of the printed circuit board 10 provided on panel 12.

After plating, panel 12 is then subjected to a "stripping" process. During the stripping process, the resist material 18 is removed, leaving the plated material layer 32 and other optional electroplated material layers (not shown) as illustrated by FIG. 3d. The plated material layer 32 is provided on the panel 12 in the desired circuitry pattern 22 which includes the serpentine plating buss, such as for example, the accordion plating buss 24 illustrated by FIGS. 3 and 4, or one of the plating busses illustrated by FIGS. 6a-6c. After stripping, the panel 12 is then singulated into individual PCBs 10.

With refer to FIG. 3, a conventional saw blade is employed at the PCB singulation stage. If there is no indexing errors, the saw blade will remove the material of the panel located between parallel lines 34 and 36 as a cut is made along a street 38. As can be imaged, making such a cut will separate the adjacent boards 10 and remove a portion of the serpentine plating buss 24, which disconnects the associated traces 26. Since the design of the serpentine plating buss 24 zigzags over the street 38, the entire plating buss need not be removed in order to disconnect the traces, unlike the straight-line plating buss shown in FIGS. 1 and 2.

It is also to be appreciated that the "process window" defined by the serpentine plating buss 24 is larger than the prior art straight-line plating buss shown in FIGS. 1 and 2. In this manner, even if over time, indexing errors result in the cut moving from the center of the street 38, the saw blade will still remove a portion of the serpentine plating buss 24 and disconnect the traces 26 in both adjacent boards 10, such as illustrated by FIG. 4. Accordingly, board yield is increased as fewer PCBs are rejected with shorted traces. In one embodiment, a panel 12 provided with the serpentine plating buss of the present invention enlarges the PCB singulation process window to greater or equal to about ±0.165 mm from centerline of the street, as compared to a prior art process windows of less than or equal to about ±0.085 mm from centerline of the street. It is to be appreciated that the process window of the present invention is solely dependent upon the width of the serpentine pattern, whereas the prior art process window is dependent on saw blade width, buss line width, positional accuracy of the saw blade, and positional accuracy of the buss to the fixing feature.

Although the additive method was described in the formation of the plating buss of the present invention, those skilled in the art recognize that the subtractive method of forming a PCB may also be used. For example, in the subtractive method, a plurality of boards defined by a substrate is provided having at least one surface coated with a conductive material, such as a metal like copper. The circuitry pattern including an embodiment of a plating buss design according to the present invention is then printed onto the conducive material-coated surface of the board by a resist material. The remaining exposed conductive material-coated surface is etched away, and the resist is then removed leaving conductive circuitry having the serpentine plating buss of the present invention interconnecting conductive traces and adjacent PCB segments.

Additionally, although dicing was described as a suitable method for PCB singulation, the plating buss according to the present is also beneficial to panel subjected to other PCB singulation methods, such as for example, punching or stamping.

Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A substrate panel comprising:
   a plurality of printed circuit boards suitable for singulation using a saw blade having a width defining a first process window, each printed circuit board having a plurality of conductive traces provided on a planar surface of the substrate, wherein said plurality of conductive traces on one of said plurality of printed circuit boards is offset from said plurality of conductive traces on an adjacent one of said plurality of printed circuit boards; and
   a serpentine plating buss provided on said planar surface between adjacent ones of said plurality of printed circuit boards and interconnecting said plurality of offset conductive traces, and wherein said serpentine plating buss comprises a plurality of lateral segments positioned perpendicularly across said first process window, and a plurality of nonparallel side segments, wherein said serpentine plating buss extends laterally in a full pattern a distance greater than the width of the saw blade such that said serpentine plating bus defines a second process window significantly larger than the first process window.

2. The substrate panel of claim 1 wherein the serpentine plating buss is provided in an accordion pattern.

3. The substrate panel of claim 1 wherein the serpentine plating buss is continuous from one end of the substrate panel to another end of the substrate panel.

4. The substrate panel of claim 1 wherein the serpentine plating buss is non-continuous from one end of the substrate panel to another end of the substrate panel.

5. The substrate panel of claim 1 wherein the plurality of nonparallel side segments of the serpentine plating buss is provided in a saw toothed pattern.

6. The substrate panel of claim 1 wherein the plurality of nonparallel side segments of the serpentine plating buss is provided in a triangular pattern.

7. The substrate panel of claim 1 wherein the plurality of nonparallel side segments of the serpentine plating buss is provided in a curvilinear pattern.

8. The substrate panel of claim 1 wherein the plurality of nonparallel side segments of the serpentine plating buss are provided in a pattern selected from the group comprising accordion, saw toothed, triangular, curvilinear pattern, and combinations thereof.

9. The substrate panel of claim 1 wherein the substrate panel further comprises a plurality of various sized holes.

10. A substrate panel comprising:
    a plurality of printed circuit boards suitable for singulation using a saw blade having a width defining a first process window, each printed circuit board having a plurality of conductive traces provided on a planar surface of the substrate, wherein said plurality of conductive traces on one of said plurality of printed circuit boards is offset from said plurality of conductive traces on an adjacent one of said plurality of printed circuit boards;

a serpentine plating buss provided on said planar surface between adjacent ones of said plurality of printed circuit boards and interconnecting said plurality of offset conductive traces, and wherein said serpentine plating buss comprises a plurality of lateral segments positioned perpendicularly across said first process window, and a plurality of nonparallel side segments, wherein said serpentine plating buss extends laterally in a full pattern a distance greater than the width of the saw blade such that said serpentine plating bus defines a second process window significantly larger than the first process window; and the plurality of nonparallel side segments of said serpentine plating buss are provided in a pattern selected from the group comprising accordion, saw toothed, triangular, curvilinear pattern, and combinations thereof.

11. The substrate panel of claim 10 wherein the serpentine plating buss is provided in an accordion pattern.

12. The substrate panel of claim 10 wherein the serpentine plating buss is continuous from one end of the substrate panel to another end of the substrate panel.

13. The substrate panel of claim 10 wherein the serpentine plating buss is non-continuous from one end of the substrate panel to another end of the substrate panel.

14. The substrate panel of claim 10 wherein the plurality of nonparallel side segments of the serpentine plating buss is provided in a saw toothed pattern.

15. The substrate panel of claim 10 wherein the plurality of nonparallel side segments of the serpentine plating buss is provided in a triangular pattern.

16. The substrate panel of claim 10 wherein the plurality of nonparallel side segments of the serpentine plating buss is provided in a curvilinear pattern.

17. The substrate panel of claim 10 wherein the substrate panel further comprises a plurality of various sized holes.

* * * * *